United States Patent
Zhang et al.

(10) Patent No.: US 8,586,405 B2
(45) Date of Patent: Nov. 19, 2013

(54) SEMICONDUCTOR DEVICE MANUFACTURING METHOD

(75) Inventors: Chao Zhang, Beijing (CN); Guanping Wu, Beijing (CN); Bo Liu, Beijing (CN); Zhitang Song, Shanghai (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/369,738

(22) Filed: Feb. 9, 2012

(65) Prior Publication Data

US 2013/0134381 A1 May 30, 2013

(30) Foreign Application Priority Data

Nov. 25, 2011 (CN) .......................... 2011 1 0379131

(51) Int. Cl.
*H01L 29/02* (2006.01)
(52) U.S. Cl.
USPC ............ 438/102; 257/2; 257/3; 257/4; 257/5; 257/E29.002; 438/103; 438/104
(58) Field of Classification Search
USPC .................... 257/2–5, E29.002; 438/102–104
See application file for complete search history.

(56) References Cited

U.S. PATENT DOCUMENTS 5,856,695 A * 1/1999 Ito et al. ........................ 257/370

FOREIGN PATENT DOCUMENTS

CN 102412179 4/2012

OTHER PUBLICATIONS

Chao Zhang, et al., "Design and Fabrication of Dual-Trench Epitaxial Diode Array for High-Density Phase-Change Memory", IEEE Electron Device Letters vol. 32, No. 8, Aug. 2011.
J.H. Oh, et al., "Full Integration of Highly Manufacturable 512Mb PRAM based on 90nm Technology", Adv. Tech. Dev. and Process Dev. Team, Semiconductor R&D Div., Samsung.

* cited by examiner

*Primary Examiner* — Jami M Valentine
(74) *Attorney, Agent, or Firm* — Koppel, Patrick, Heybl & Philpott; Michael J. Ram (57) ABSTRACT

A method of manufacturing a semiconductor device and a semiconductor device made by the method is disclosed. The method comprises forming a buried N+ layer in an upper portion of a P-type substrate; performing ion implantation on the buried N+ layer; annealing the buried N+ layer; forming an epitaxial semiconductor layer on the buried N+ layer through epitaxial deposition, wherein, an upper portion of said epitaxial semiconductor layer and a portion underlying said P+ region of said epitaxial semiconductor layer are doped to form a P+ region and an N− region, respectively. Increasing the ion implant dosage of the BNL layer, adjusting the method of annealing the BNL layer to increase the width of the BNL layer, or increasing the thickness of the EPI layer, reduces the vertical BJT current gain and suppressed the substrate leakage current.

16 Claims, 7 Drawing Sheets

SEMICONDUCTOR DEVICE MANUFACTURING METHOD

CROSS-REFERENCE TO RELATED APPLICATIONS

This application claims priority to Chinese Patent Application No. 201110379131.1, filed on Nov. 25, 2011 and entitled "Semiconductor Device and Manufacturing Method thereof", which is incorporated herein in its entirety by reference.

FIELD OF THE INVENTION

The present invention relates to semiconductor devices and a method for manufacturing semiconductor device, and more specifically, relates to semiconductor devices that are capable of suppressing substrate leakage and a manufacturing method thereof.

DESCRIPTION OF THE RELATED ART

Phase change random access memory (abbreviated as PCRAM) is an emerging non-volatile memory technology that is expected to be highly scalable, endurable, and readily writable and readable, and thus become a semiconductor memory technology that is widely considered to be most competitive.

Currently, access to PCRAM is typically controlled by a complementary metal-oxide semiconductor (abbreviated as CMOS), a bipolar junction transistor (abbreviated as BJT) or a diode. Diodes occupy smaller cell size and provide higher programming current, and thus, in terms of the cell size, the diode-selected PCRAM is the superior alternative.

The inventor of the present invention has conducted in-depth research on the current diode-selected PCRAM and found that substrate leakage occurs due to vertical BJT parasitic effects. Explanations are provided below utilizing a dual shallow trench isolated epitaxial diode array as an example.

Figure 1:
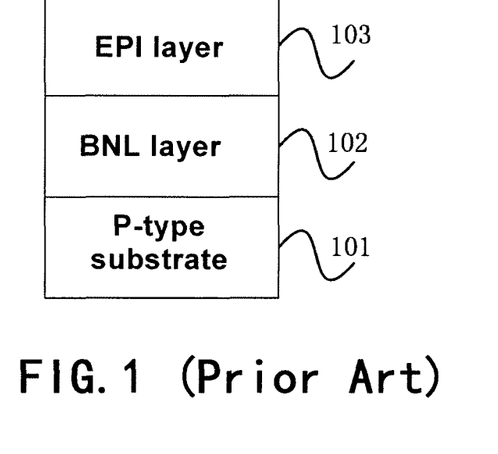
FIG. 1 is a diagram showing the basic structure of a prior art semiconductor device for manufacturing a dual shallow trench isolated epitaxial diode array.

Currently, in order to further increase PCRAM density, a technology for manufacturing PCRAM using a dual shallow trench isolated epitaxial diode array is utilized. FIG. 1 is a diagram showing the basic structure of a semiconductor device for manufacturing a dual shallow trench isolated epitaxial diode array. As shown in FIG. 1, a buried N+ layer 102 (abbreviated as BNL) is formed on a P-type substrate 101, and then an epitaxial semiconductor layer 103 (abbreviated as EPI) is formed on the BNL layer 102 through epitaxial deposition. The upper portion of the EPI layer 103 is doped to form a P+ region while the portion of the EPI layer 103 underlying the P+ region is doped to form an N− region. Subsequently, the basic structure of the semiconductor device is subjected to a processing using photolithography, thereby obtaining a dual shallow trench isolated epitaxial diode array.

Figure 2:
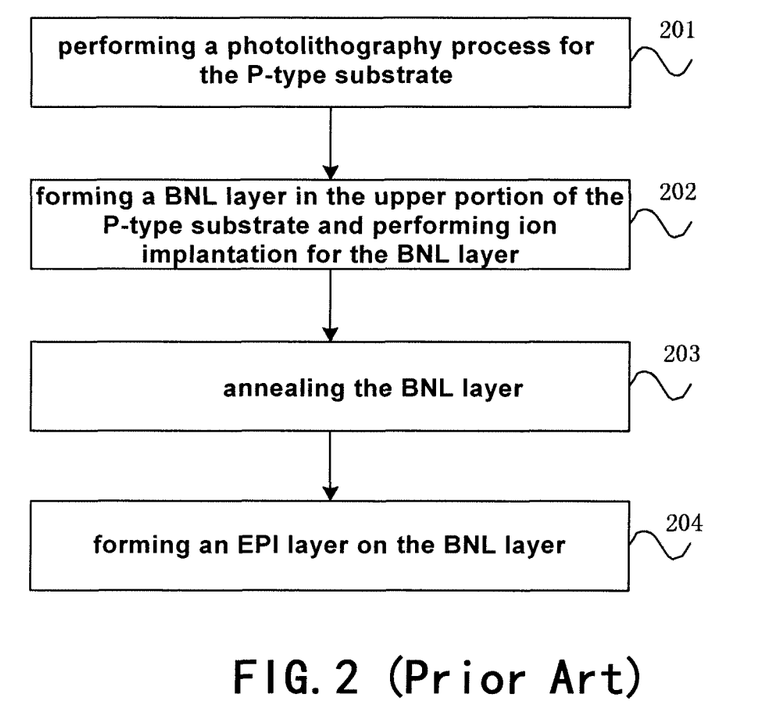
FIG. 2 is a flowchart showing a prior art formation of a BNL layer and an EPI layer on a P-type substrate.

FIG. 2 is a flowchart describing the formation of the BNL layer and the EPI layer on the prior art P-type substrate of FIG. 1.

First, at step 201, a photolithography process is performed on the P-type substrate to define thereon a region in which the BNL layer is to be formed.

At step 202, the BNL layer is formed in the aforementioned region of the P-type substrate, and ion implantation on the BNL layer is performed. Generally, as an example, the implanted ions are arsenic (As), with an implant dosage of $1.0 \times 10^{14}/cm^2$ and a voltage of 75 Kev.

At step 203, the BNL layer is subjected to an annealing treatment. Typically, a rapid thermal annealing treatment is employed, with an anneal temperature of 950° C. and an anneal time of 30 seconds.

At step 204, the EPI layer is formed on the BNL layer through epitaxial deposition.

Figure 3:
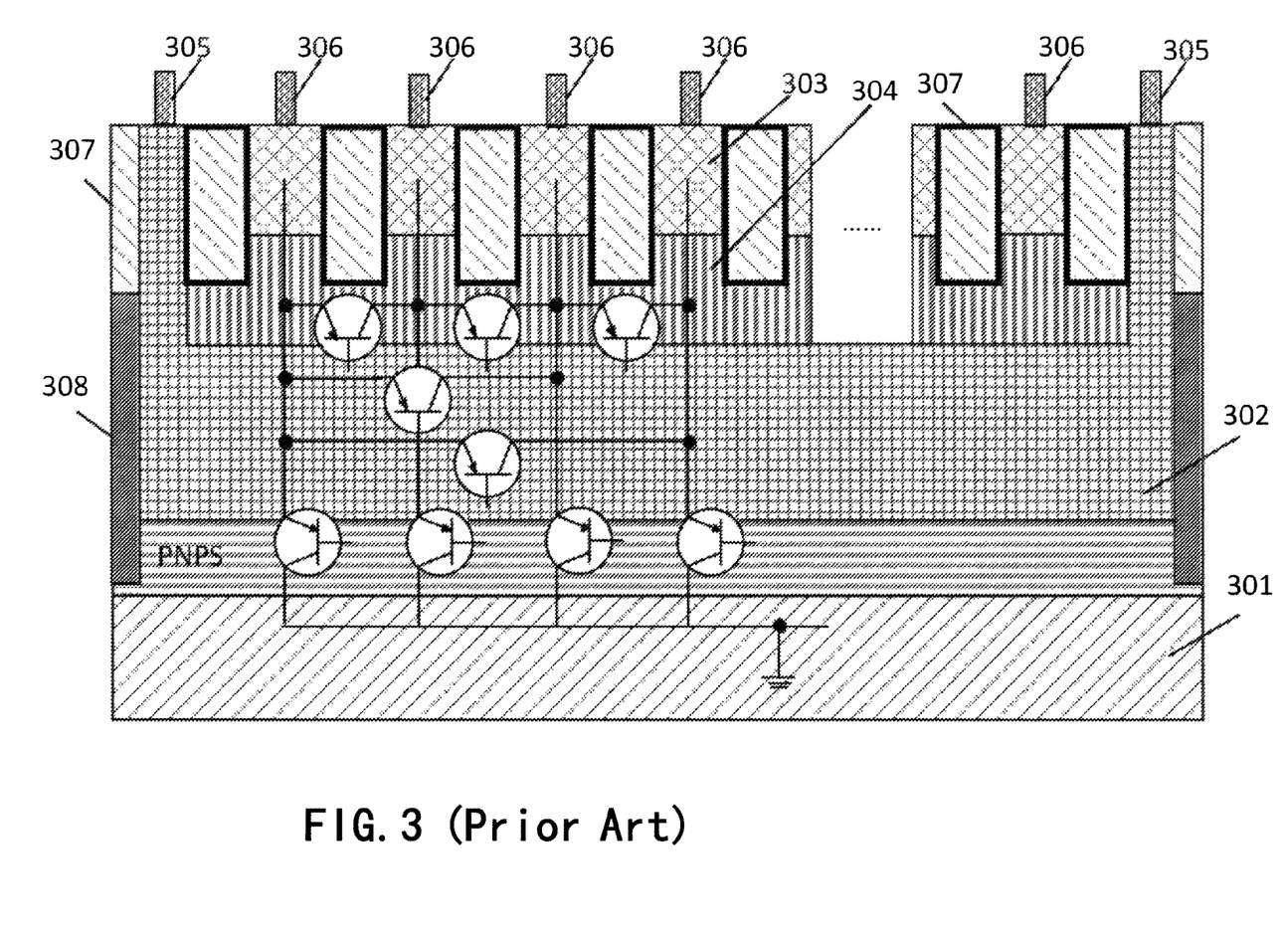
FIG. 3 is a diagram showing a prior art dual shallow trench isolated epitaxial diode array.

FIG. 3 is a diagram showing a prior art dual shallow trench isolated epitaxial diode array.

As shown in FIG. 3, a BNL layer 302 and an EPI layer are formed in turn on a P-type substrate 301.

A P+ regions 303 and an N− region 304 underlying the P+ regions 303 in the EPI layer constitute an epitaxial diode.

The P+ regions 303 in the EPI layer are electrically connected to a bit lines 306. The BNL layer 302 is electrically connected to a word line 305. Among the respective P+ regions 303 in the EPI layer as well as between the P+ regions 303 and the BNL layer 302, shallow trench isolations 307 are provided. At the two sides of the BNL layer 302, deep trenches 308 are provided.

The inventor of the present invention has found that, in the structure shown in FIG. 3, a BJT parasitic effect is produced. Specifically, the P+ regions 303 in the EPI layer constitute an emitter area of the vertical BJT (PNPS), the N− region 304 in the EPI layer and the BNL layer 302 constitute a base area of the vertical BJT, and the P-type substrate 301 constitutes a collector area of the vertical BJT. Since the BNL layer 302 is an N+ region, a P+/N−/N+/P− structure is formed in the vertical direction, resulting in the occurrence of the vertical BJT parasitic effect. When a certain voltage is applied on the N+ BNL layer 302 through the word line 305, substrate leakage appears in the vertical direction.

For a diode array, substrate leakage not only degrades diode programming current, but also increases power consumption of the diode array. Substrate leakage refers to the ratio of P-type substrate leakage current ($I_{PSUB}$) to the current ($I_{BL0}$) of the programming diode. Under baseline conditions, the substrate leakage ratio is about 8% at a forward biased voltage of 2V due to the vertical BJT parasitic effect.

SUMMARY OF THE INVENTION

The inventor of the present invention has found that there are problems in the prior art and thus proposes a new technical solution to address at least one of the problems.

An object of the present invention is to provide a technical solution for a method of manufacturing a semiconductor device and a semiconductor device.

According to a first aspect of the present invention, there is provided a method of manufacturing semiconductor devices, comprising the steps of forming a buried N+ layer in an upper portion of a P-type substrate; performing ion implantation for the buried N+ layer, with an ion implant dosage larger than $1.0 \times 10^{14}/cm^2$; annealing the buried N+ layer; forming an epitaxial semiconductor layer on the buried N+ layer through epitaxial deposition, wherein, an upper portion of said epitaxial semiconductor layer is doped to form a P+ region and a portion of said epitaxial semiconductor layer underlying said P+ region is doped to form an N− region.

Preferably, said P+ region and said N− region form a diode, and said epitaxial semiconductor layer has a thickness larger than or equal to the total vertical length of said P+ region and said N− region.

Preferably, said buried N+ layer and said epitaxial semiconductor layer are etched to form a strip buried N+ layer and a strip epitaxial semiconductor layer, respectively. Said strip epitaxial semiconductor layer is etched to form a columnar epitaxial semiconductor layer.

Preferably, said P+ region is electrically connected to a bit line of a phase change memory cell array, and said buried N+ layer is electrically connected to a word line of said phase change memory cell array.

Preferably, the ion implant dosage ranges from $5.0\times10^{14}/cm^2$ to $5.0\times10^{16}/cm^2$.

Preferably, the implanted ions are As, Sb, or P.

Preferably, the step of annealing the buried N+ layer comprises performing a rapid thermal annealing of the buried N+ layer.

Preferably, the step of annealing the buried N+ layer further comprises, after performing the rapid thermal annealing for the buried N+ layer, performing a high temperature annealing of the buried N+ layer, with an anneal temperature ranging from 800° C. to 1350° C. and an anneal time ranging from 5 minutes to 120 minutes.

Preferably, the step of annealing the buried N+ layer further comprises performing a high temperature annealing for the buried N+ layer, with an anneal temperature ranging from 800° C. to 1350° C. and an anneal time ranging from 5 minutes to 120 minutes.

According to a second aspect of the present invention, there is provided a method of manufacturing semiconductor devices, comprising the steps of forming a buried N+ layer in an upper portion of a P-type substrate; performing ion implantation on the buried N+ layer; performing a high temperature annealing of the buried N+ layer, with an annealing temperature ranging from 800° C. to 1350° C. and an annealing time ranging from 5 minutes to 120 minutes; forming an epitaxial semiconductor layer on the buried N+ layer through epitaxial deposition, wherein, an upper portion of said epitaxial semiconductor layer is doped to form a P+ region and a portion of said epitaxial semiconductor layer underlying said P+ region is doped to form an N− region.

Preferably, before performing a high temperature annealing of the buried N+ layer, said method further comprises performing a rapid thermal annealing of the buried N+ layer.

Preferably, said P+ region and said N− region form a diode, and said epitaxial semiconductor layer has a thickness larger than or equal to the total vertical length of said P+ region and said N− region.

Preferably, said buried N+ layer and said epitaxial semiconductor layer are etched to form a strip buried N+ layer and a strip epitaxial semiconductor layer, respectively. Said strip epitaxial semiconductor layer is etched to form a columnar epitaxial semiconductor layer.

Preferably, said P+ region is electrically connected to a bit line of a phase change memory cell array, and said buried N+ layer is electrically connected to a word line of said phase change memory cell array.

According to a third aspect of the present invention, there is provided a method of manufacturing semiconductor devices, comprising the steps of forming a buried N+ layer in an upper portion of a P-type substrate; performing ion implantation for the buried N+ layer; annealing the buried N+ layer; forming an epitaxial semiconductor layer on the buried N+ layer through epitaxial deposition, wherein, an upper portion of said epitaxial semiconductor layer is doped to form a P+ region and a portion of said epitaxial semiconductor layer underlying said P+ region is doped to form an N− region, wherein, said P+ region and said N− region forming a diode, and said epitaxial semiconductor layer has a thickness larger than or equal to the total vertical length of said P+ region and said N− region.

Preferably, said buried N+ layer and said epitaxial semiconductor layer are etched to form a strip buried N+ layer and a strip epitaxial semiconductor layer, respectively. Said strip epitaxial semiconductor layer is etched to form a columnar epitaxial semiconductor layer.

Preferably, said P+ region is electrically connected to a bit line of a phase change memory cell array, and said buried N+ layer is electrically connected to a word line of said phase change memory cell array.

Preferably, the step of annealing the buried N+ layer comprises performing a rapid thermal annealing of the buried N+ layer.

According to the fourth aspect of the present invention, there is provided a semiconductor device, comprising a P-type substrate; a buried N+ layer located in said P-type substrate and having an ion implant dosage larger than $1.0\times10^{14}/cm^2$; an epitaxial semiconductor layer located on said buried N+ layer, wherein, an upper portion of said epitaxial semiconductor layer is doped to form a P+ region and a portion of said epitaxial semiconductor layer underlying said P+ region is doped to form an N− region.

Preferably, said P+ region and said N− region form a diode, and said epitaxial semiconductor layer has a thickness larger than or equal to the total vertical length of said P+ region and said N− region.

Preferably, said buried N+ layer and said epitaxial semiconductor layer are etched to form a strip buried N+ layer and a strip epitaxial semiconductor layer, respectively. Said strip epitaxial semiconductor layer is further etched to form a columnar epitaxial semiconductor layer.

Preferably, said P+ region is electrically connected to a bit line of a phase change memory cell array, and said buried N+ layer is electrically connected to a word line of said phase change memory cell array.

Preferably, the ion implant dosage ranges from $5.0\times10^{14}/cm^2$ to $5.0\times10^{16}/cm^2$.

Preferably, the implanted ions are As, Sb, or P.

Preferably, a distribution width of N ions in said buried N+ layer in a vertical direction is between 200 nm and 800 nm.

Preferably, said epitaxial semiconductor layer has a thickness ranging from 1000 Å to 6000 Å.

According to the fifth aspect of the present invention, there is provided a semiconductor device, comprising a P-type substrate; a buried N+ layer located in said P-type substrate, wherein, a distribution width of N ions in said buried N+ layer in a vertical direction ranges from 200 nm to 800 nm; an epitaxial semiconductor layer located on said buried N+ layer, wherein, an upper portion of said epitaxial semiconductor layer is doped to form a P+ region and a portion of said epitaxial semiconductor layer underlying said P+ region is doped to form an N− region.

Preferably, said P+ region and said N− region form a diode, and said epitaxial semiconductor layer has a thickness larger than or equal to the total vertical length of said P+ region and said N− region.

Preferably, said buried N+ layer and said epitaxial semiconductor layer are etched to form a strip buried N+ layer and a strip epitaxial semiconductor layer, respectively. Said strip epitaxial semiconductor layer is further etched to form a columnar epitaxial semiconductor layer.

Preferably, said P+ region is electrically connected to a bit line of a phase change memory cell array, and said buried N+ layer is electrically connected to a word line of said phase change memory cell array.

Preferably, said epitaxial semiconductor layer has a thickness ranging from 1000 Å to 6000 Å.

According to the sixth aspect of the present invention, there is provided a semiconductor device, comprising a P-type substrate; a buried N+ layer located in said P-type substrate; an epitaxial semiconductor layer located on said buried N+ layer, wherein, an upper portion of said epitaxial semiconductor layer is doped to form a P+ region and a portion of said epitaxial semiconductor layer underlying said P+ region is doped to form an N− region, wherein, said P+ region and said N− region form a diode, and said epitaxial semiconductor layer has a thickness larger than or equal to the total vertical length of said P+ region and said N− region.

Preferably, said buried N+ layer and said epitaxial semiconductor layer are etched to form a strip buried N+ layer and a strip epitaxial semiconductor layer, respectively. Said strip epitaxial semiconductor layer is further etched to form a columnar epitaxial semiconductor layer.

Preferably, said P+ region is electrically connected to a bit line of a phase change memory cell array, and said buried N+ layer is electrically connected to a word line of said phase change memory cell array.

Preferably, said epitaxial semiconductor layer has a thickness ranging from 1000 Å to 6000 Å.

According to the above aspects of the present invention, by using an increased ion implant dosage, or by adjusting the manner for annealing the buried N+ layer to increase the width of the buried N+ layer, or by increasing the thickness of the epitaxial semiconductor layer, the vertical bipolar junction transistor parasitic effect can be effectively suppressed, thereby suppressing substrate leakage.

Further features of the present invention and advantages thereof will become apparent from the following detailed description of exemplary embodiments of the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention can be more clearly understood from the following detailed description with reference to the drawings, in which.

DESCRIPTION OF THE EMBODIMENTS

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

Also, it should be understood that, for the convenience of description, each component in the figures has not been necessarily drawn to scale.

The following description of each exemplary embodiment is merely illustrative in nature and is in no way intended to limit the invention, its application, or uses.

Techniques, methods and apparatus known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, and thus once an item is defined in one figure, it is possible that it need not be further discussed for the following figures.

As described above, the inventor of the present invention has found that, the P-type substrate, the BNL layer and the epitaxial semiconductor layer together constitute the vertical parasitic BJT, resulting in substrate leakage.

The inventive concept of the present invention resides in that the parasitic BJT current gain can be reduced by adjusting the formation process of the buried N+ layer (BNL) and the epitaxial semiconductor layer (EPI), thereby suppressing substrate leakage.

The inventor of the embodiments of the present invention has found that, during the PCRAM fabrication process, by increasing the BNL ion implant dosage, by adjusting the manner for annealing the BNL layer to increase the width of the BNL layer, or by increasing the thickness of the EPI layer, the parasitic BJT current gain can be reduced and the vertical BJT parasitic effect can be suppressed effectively, thereby suppressing substrate leakage.

First Embodiment

The method of manufacturing a semiconductor device according to a first embodiment of the present invention is described with reference to FIG. 4.

At step 401, a BNL layer is formed in the upper portion of the P-type substrate.

At step 402, ion implantation of the BNL layer is performed, with an ion implant dosage larger than $1.0 \times 10^{14}/cm^2$. Preferably, the ion implant dosage can range from $5.0 \times 10^{14}/cm^2$ to $5.0 \times 10^{16}/cm^2$. More preferably, the ion implant dosage can range from $5.0 \times 10^{15}/cm^2$ to $5.0 \times 10^{16}/cm^2$.

At step 403, the buried N+ layer is annealed.

At step 404, an EPI layer is formed on the BNL layer using epitaxial deposition, wherein an upper portion of the EPI layer is doped to form a P+ region and a portion of the EPI layer underlying the P+ region is doped to form an N− region.

Figure 4:
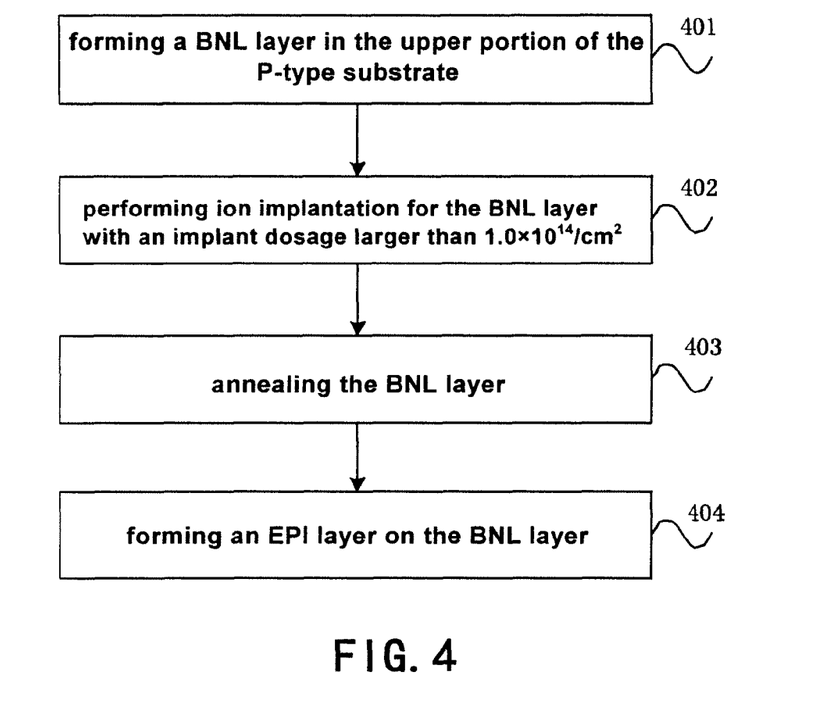
FIG. 4 is a flowchart showing steps for manufacturing a semiconductor device according to a first embodiment of the present invention.

Using the method of manufacturing a semiconductor device according to the first embodiment of the present invention as shown in FIG. 4, due to the increase of the ion implant dosage for the BNL layer, the concentration of the vertical BJT base area is increased. With the increase of the N ion concentration in the vertical BJT base area, the vertical BJT current gain decreases, thereby effectively suppressing substrate leakage.

According to a particular implementation of this embodiment, the implanted ions are As, Sb, or P.

Figure 5:
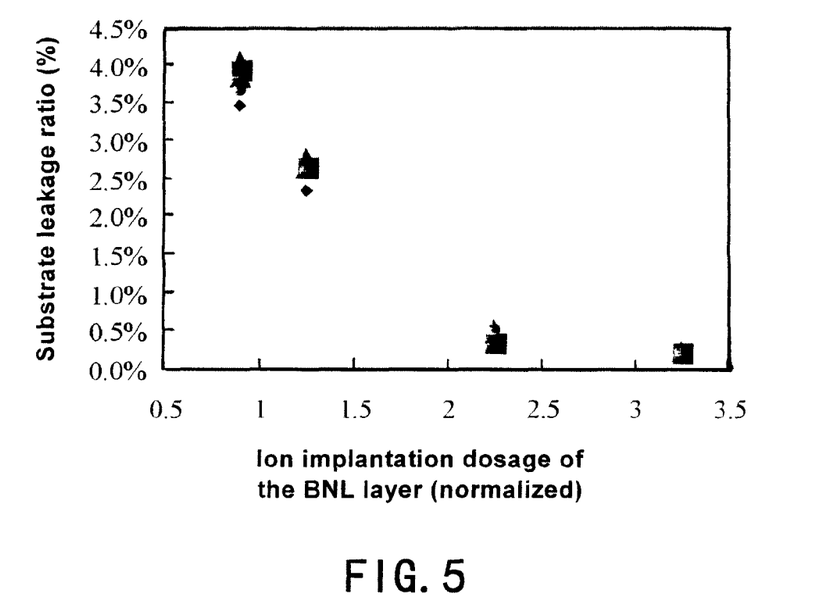
FIG. 5 is a graph showing the substrate leakage ratio as a function of the ion implant dosage of the BNL layer.

FIG. 5 is a graph showing the substrate leakage ratio as a function of the ion implant dosage of the BNL layer. It can be seen from FIG. 5 that, as the ion implant dosage of the BNL layer increases, the substrate leakage ratio decreases significantly.

The semiconductor device obtained through the method according to this embodiment comprises a P-type substrate, a BNL layer and an EPI layer.

The BNL layer is formed in the upper portion of the P-type substrate, and the ion implant dosage of the BNL layer is larger than $1.0 \times 10^{14}/cm^2$. Preferably, the ion implant dosage can range from $5.0 \times 10^{14}/cm^2$ to $5.0 \times 10^{16}/cm^2$. More preferably, the ion implant dosage can range from $5.0 \times 10^{15}/cm^2$ to $5.0 \times 10^{16}/cm^2$.

The EPI layer is located over the BNL layer. The upper portion of the EPI layer is doped to form a P+ region and the portion of the EPI layer underlying the P+ region is doped to form an N− region.

Second Embodiment

The method of manufacturing a semiconductor device according to the second embodiment of the present invention is described with reference to FIG. 6.

At step 601, the BNL layer is formed in the upper portion of the P-type substrate.

At step 602, ion implantation is performed for the BNL layer.

At step 603, the BNL layer is subjected to high temperature annealing, wherein, the annealing temperature ranges from 800° C. to 1350° C. and the annealing time ranges from 5 minutes to 120 minutes.

At step 604, the EPI layer is formed on the BNL layer using epitaxial deposition, wherein, the upper portion of the EPI layer is doped to form a P+ region and the portion of the EPI layer underlying the P+ region is doped to form an N− region.

Figure 6:
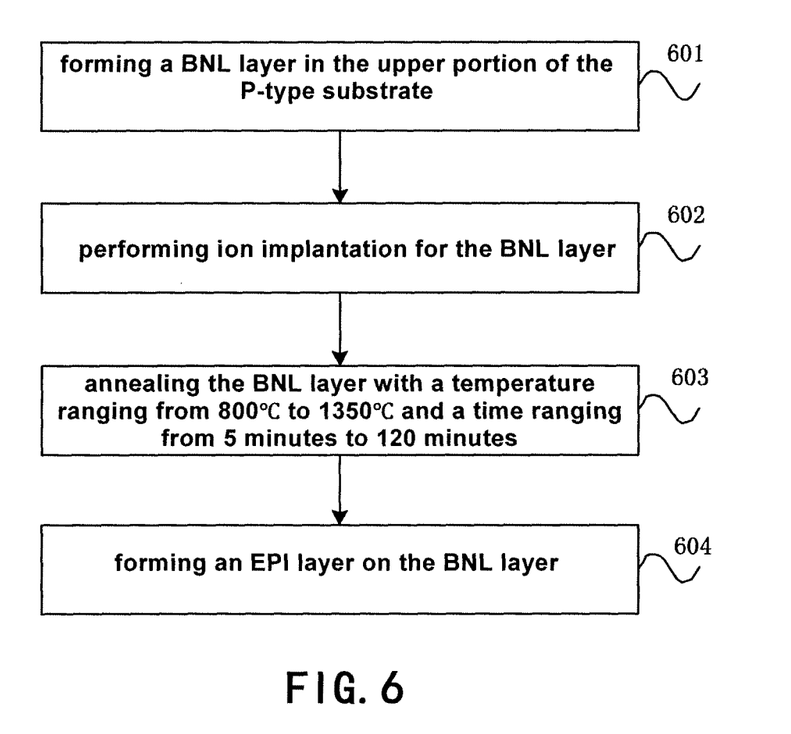
FIG. 6 is a flowchart showing steps for manufacturing a semiconductor device according to a second embodiment of the present invention.

In the method of manufacturing a semiconductor device according to a second embodiment of the present invention as shown in FIG. 6, since the BNL layer is subjected to high temperature annealing, the width of the BNL layer is increased. Here, the width of the BNL layer refers to the width of the BNL layer along a vertical direction, i.e. the vertical width of the impurity distribution area formed through ion implantation. As the width of the BNL layer increases, the width of the vertical BJT base area increases as well, and thus the vertical BJT current gain decreases. As a result, the substrate leakage current is effectively suppressed.

According to a particular implementation of this embodiment, the distribution width of the N ions in the BNL layer in the vertical direction ranges from 200 nm to 800 nm.

According to another particular implementation of this embodiment, before carrying out step 603, the BNL layer is subjected to a rapid thermal annealing.

Figure 7:
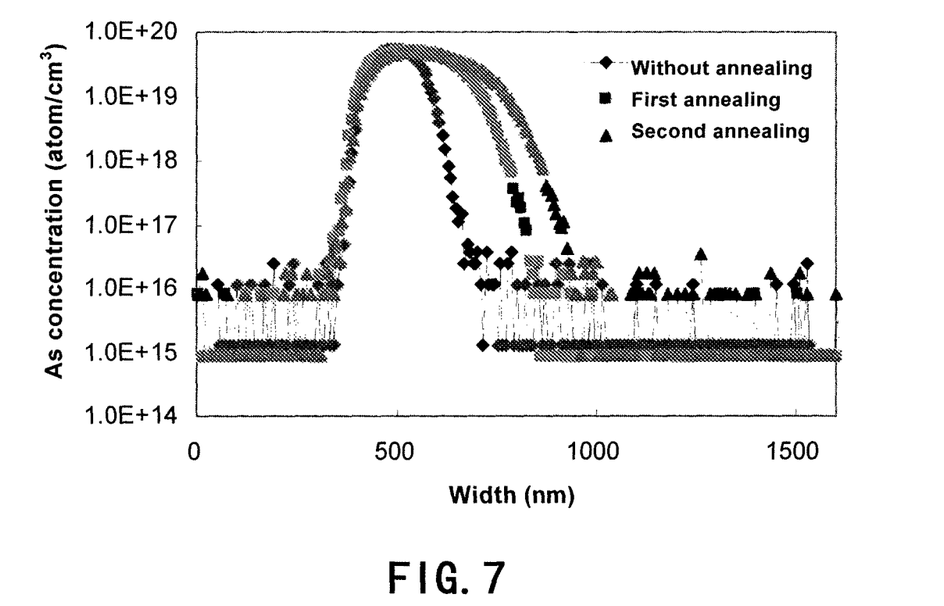
FIG. 7 is a graph showing the impurity distribution of the BNL layer under different thermal exposure conditions.

FIG. 7 is a graph showing the impurity distribution of the BNL layer under different thermal conditions.

In FIG. 7, the ions implanted into the BNL layer are As. The thermal conditions include performing no high temperature annealing, a high temperature annealing with an annealing temperature of 1050° C. and an annealing time of 10 minutes (hereinafter referred to as a first annealing), or a high temperature annealing with an annealing temperature of 1050° C. and an annealing time of 60 minutes (hereinafter referred to as a second high temperature annealing) is performed.

It can be seen from FIG. 7 that, when no high temperature annealing has been performed, the As concentration remains at a relatively higher level at a relatively smaller BNL width. For example, the AS concentration is larger than $1.0 \times 10^{16}$ atom/cm$^3$ at a relatively smaller BNL width. With the first high temperature annealing condition, the As concentration can be larger than $1.0 \times 10^{16}$ atom/cm$^3$ at a relatively larger BNL width. With the second annealing condition, the As concentration can be larger than $1.0 \times 10^{16}$ atom/cm$^3$ at a much larger BNL width.

With the increase of the BNL width, the width of the vertical BJT base area increases as well, and thus the vertical BJT current gain decreases, effectively suppressing the substrate leakage current.

The semiconductor device obtained through the method according this embodiment comprises a P-type substrate, a BNL layer and an EPI layer.

The BNL layer is formed in the upper portion of the P-type substrate, and the distribution width of the N ions in the BNL layer in the vertical direction ranges from 200 nm to 800 nm.

The EPI layer is located on the BNL layer. The upper portion of the EPI layer is doped to form a P+ region and the portion of the EPI layer underlying the P+ region is doped to form an N− region.

Third Embodiment

The method of manufacturing a semiconductor device according to a third embodiment of the present invention will be described with reference to FIG. 8.

At step 801, the BNL layer is formed in the upper portion of the P-type substrate.

At step 802, ion implantation is performed for the BNL layer.

At step 803, the BNL layer is subjected to annealing.

At step 804, the EPI layer is formed on the BNL layer through epitaxial deposition, wherein, the upper portion of the EPI layer is doped to form a P+ region and the portion of the EPI layer underlying the P+ region is doped to form an N− region. The P+ region and the N− region form a diode, and the epitaxial semiconductor layer has a thickness larger than or equal to the total vertical length of the P+ region and the N− region. When the thickness of the EPI layer is larger than the total vertical length of the P+ region and the N− region, the EPI layer further comprises a portion underlying the N− region which is not used for forming the P+ region and the N− region.

Figure 8:
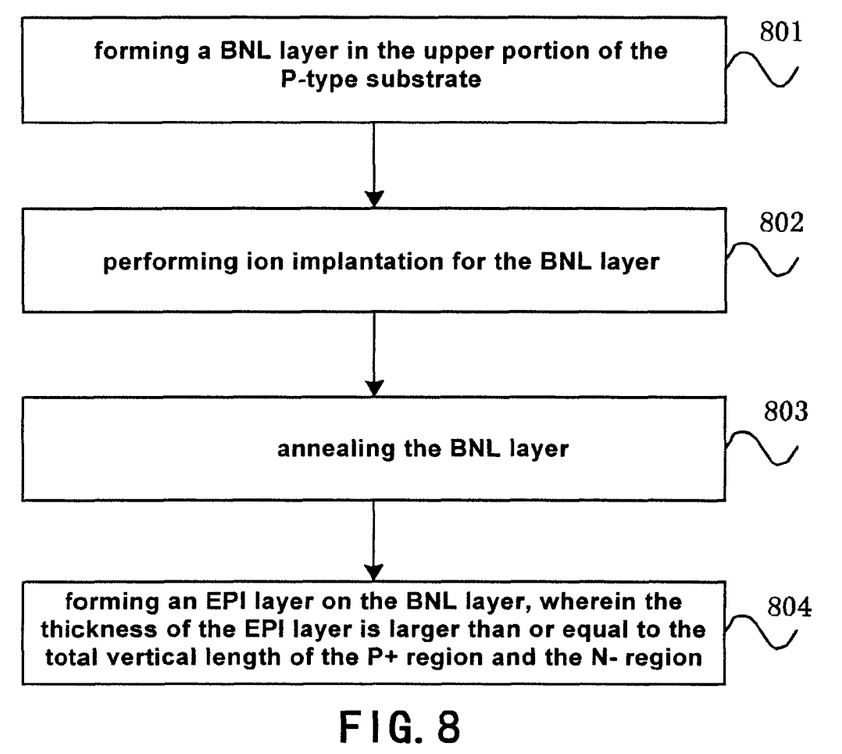
FIG. 8 is a flowchart showing steps for manufacturing a semiconductor device according to a third embodiment of the present invention.

In the method of manufacturing a semiconductor device according to the third embodiment of the present invention as shown in FIG. 8, since the P+ region in the EPI layer constitutes the emitter area of the vertical BJT, the N− region in the EPI layer, the portion underlying the N− region (i.e. between the N− region and the BNL layer) and not used for forming the P+ region and the N− region in the EPI layer (if present), and the BNL layer constitute the base area of the vertical BJT, the increase of the EPI thickness necessarily will increase the width of the base area of the vertical BJT. Accordingly, the increase of the width of the base area of the vertical BJT will decrease the vertical BJT current gain, and thus the substrate leakage current can be effectively suppressed.

According to a particular implementation of this embodiment, the thickness of the EPI ranges from 1000 Å to 6000 Å.

According to another particular implementation of this embodiment, the width of the P+ region and the width of the N− region in the EPI layer can be adjusted according to different performance requirements of the device.

Figure 9:
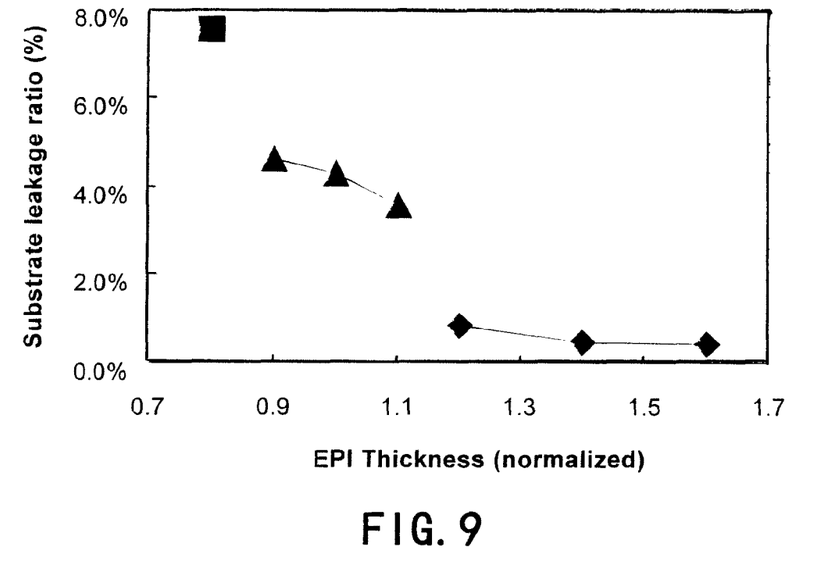
FIG. 9 is a graph showing the substrate leakage ratio as a function of the thickness of the EPI layer.

FIG. 9 is a graph showing the substrate leakage ratio as a function of the thickness of the EPI layer. It can be seen from FIG. 9 that, as the thickness of the EPI layer increases, the substrate leakage ratio decreases significantly.

The semiconductor device obtained through the method according to this embodiment comprises a P-type substrate, a BNL layer and an EPI layer.

The BNL layer is formed in the upper portion of the P-type substrate.

The EPI layer is located over the BNL layer. The upper portion of the EPI layer is doped to form a P+ region and the portion of the EPI layer underlying the P+ region is doped to form an N+ region.

The P+ region and the N− region form a diode, and the epitaxial semiconductor layer has a thickness larger than or equal to the total vertical length of the P+ region and the N− region. As described above, when the thickness of the EPI layer is larger than the total vertical length of the P+ region and the N− region, the EPI layer further comprises a portion underlying the N− region which is not used for forming the P+ region and the N− region.

In the aforementioned three embodiments, by increasing the ion implant dosage of the BNL layer, by adjusting the manner for annealing the BNL layer to increase the width of the BNL layer, or by increasing the thickness of the EPI layer, the vertical BJT parasitic effect can be suppressed effectively, thereby suppressing substrate leakage.

Fourth Embodiment

It has been found that in order to address the problem related to the substrate leakage, any two of the three procedures in the three embodiments described above can be combined, or the three procedures can be combined together in one embodiment. An embodiment where two of the three procedures are combined is not described. Below, an embodiment where the three procedures are combined together is described.

Figure 10:
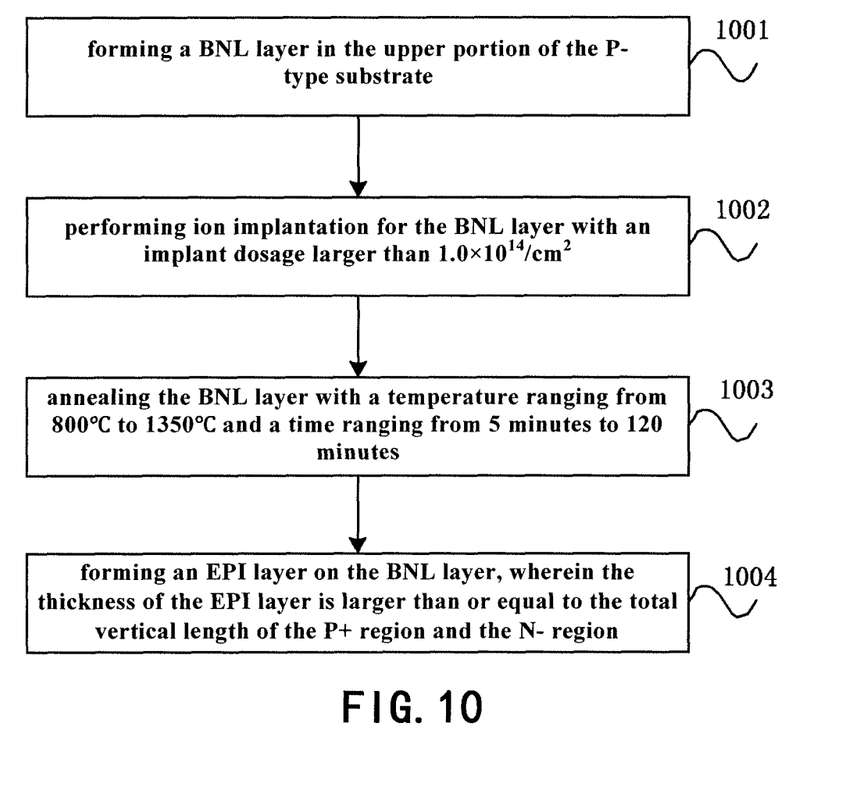
FIG. 10 is a flowchart showing steps for manufacturing a semiconductor device according to a fourth embodiment of the present invention.

The method of manufacturing a semiconductor device according to a fourth embodiment of the present invention is described with reference to FIG. 10. This embodiment combines the three embodiments described above together. In FIG. 10:

At step 1001, the BNL layer is formed in the upper portion of the P-type substrate.

At step 1002, ion implantation is performed on the BNL layer, with an ion implant dosage larger than $1.0 \times 10^{14}/cm^2$. Preferably, the ion implant dosage can range from $5.0 \times 10^{14}/cm^2$ to $5.0 \times 10^{16}/cm^2$. More preferably, the ion implant dosage can range from $5.0 \times 10^{15}/cm^2$ to $5.0 \times 10^{16}/cm^2$.

At step 1003, the BNL layer is subjected to a high temperature annealing, wherein, the annealing temperature ranges from 800° C. to 1350° C. and the annealing time ranges from 5 minutes to 120 minutes.

At step 1004, the EPI layer is formed on the buried N+ layer through epitaxial deposition, wherein, the upper portion of the EPI layer is doped to form a P+ region and the portion of the EPI layer underlying the P+ region is doped to form an N− region. The P+ region and the N− region form a diode, and the epitaxial semiconductor layer has a thickness larger than or equal to the total vertical length of the P+ region and the N− region.

With the method of manufacturing a semiconductor device according to the fourth embodiment of the present invention as shown in FIG. 10, by increasing the ion implant dosage of the BNL layer, by adjusting the manner of annealing the BNL layer to increase the width of the BNL layer, or by increasing the thickness of the EPI layer, the vertical BJT current gain can be reduced and thus the substrate leakage current can be effectively suppressed.

It can be known from the above various embodiments that, the present invention is fully compatible with the current CMOS fabrication and is a simple process without extra masks.

The present invention effectively suppresses the substrate leakage phenomenon, and thus the programming current can be improved and while the power consumption of diode array can be decreased.

Fifth Embodiment

In the aforementioned various embodiments, after the BNL layer and the EPI layer are formed in turn on the P-type substrate, photolithography can be employed in the semiconductor processing, thereby obtaining a dual shallow trench isolated epitaxial diode array. Below, an exemplary embodiment of manufacturing a dual shallow trench isolated epitaxial diode array will be described with reference to FIG. 11.

Figure 11:
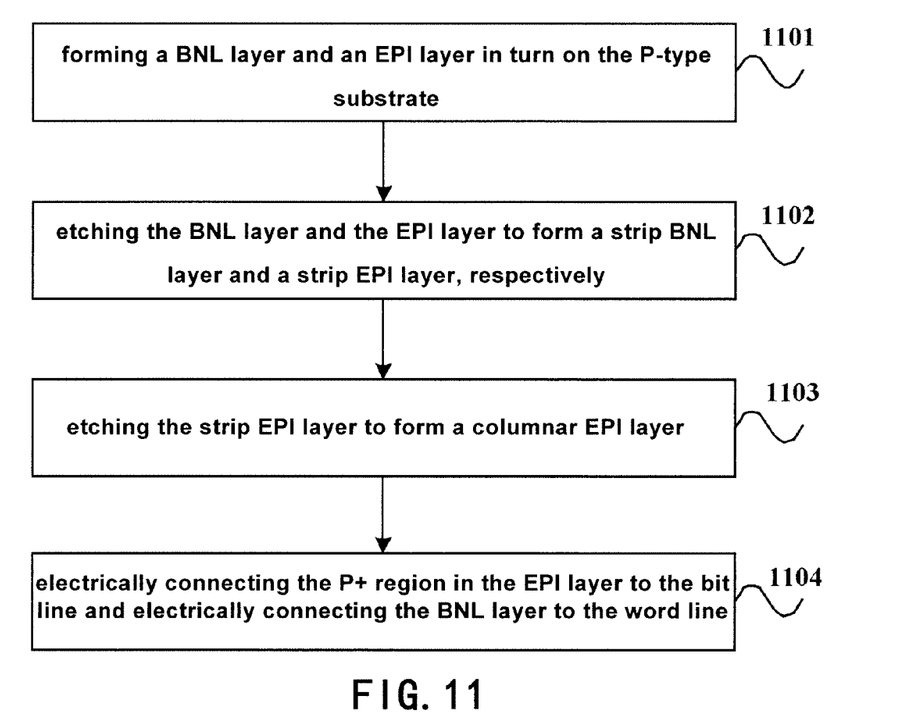
FIG. 11 is a flowchart showing steps for manufacturing a dual shallow trench isolated epitaxial diode array.

At step 1101, with the aforementioned embodiment, the BNL layer and the EPI layer are formed in turn on the P-type substrate, wherein, the upper portion of the EPI layer is doped to form a P+ region and the portion of the EPI layer underlying the P+ region is doped to form an N− region.

At step 1102, the BNL layer and the EPI layer are etched to form a strip BNL layer and a strip EPI layer, respectively.

At step 1103, the strip EPI layer is etched to form a columnar EPI layer.

At step 1104, the P+ region in the EPI layer is electrically connected to a bit line of a phase change memory cell array, and the BNL layer is electrically connected to a word line of the phase change memory cell array.

With the above steps, a dual shallow trench isolated epitaxial diode array that can suppress substrate leakage can be obtained.

The method of manufacturing a semiconductor device according to the present invention as well as the semiconductor device formed thereby has been described in detail. In order to not obscure the concept of the present invention, some details known in the art are not described. However, based on the disclosures herein one of ordinary skill in the art will know how to implement the technical solution disclosed.

Although some specific embodiments of the present invention have been described in detail with examples, it should be understood by one of ordinary skill in the art that the above examples are only intended to be illustrative but not to limit the scope of the present invention. It should be understood by one of ordinary skill in the art that the above embodiments can be modified without departing from the scope and spirit of the present invention. The scope of the present invention is defined by the attached claims.

What is claimed is:

1. A method of manufacturing a semiconductor device, comprising:
   forming a buried N+ layer in an upper portion of a P-type substrate;
   performing ion implantation of the buried N+ layer, with an ion implant dosage larger than $1.0 \times 10^{14}/cm^2$;
   annealing the buried N+ layer; and
   forming an epitaxial semiconductor layer on the buried N+ layer through epitaxial deposition, wherein, an upper portion of said epitaxial semiconductor layer is doped to form a P+ region and a portion of said epitaxial semiconductor layer underlying said P+ region is doped to form an N− region;

wherein said P+ region and said N− region form a diode, and said epitaxial semiconductor layer has a thickness greater than or equal to the total vertical length of said P+ region and said N− region.

2. The method of claim 1, further comprising:

etching said buried N+ layer and said epitaxial semiconductor layer to form a strip buried N+ layer and a strip epitaxial semiconductor layer, respectively; and etching said strip epitaxial semiconductor layer to form a columnar epitaxial semiconductor layer.

3. The method of claim 2, wherein, said P+ region is electrically connected to a bit line of a phase change memory cell array, and said buried N+ layer is electrically connected to a word line of said phase change memory cell array.

4. The method of claim 1, wherein, the ion implant dosage ranges from $5.0 \times 10^{14}/cm^2$ to $5.0 \times 10^{16}/cm^2$.

5. The method of claim 1, wherein, the implanted ions in the ion implantation step are ions of As, Sb, or P.

6. The method of claim 1, wherein, the step of annealing the buried N+ layer comprises:

performing a rapid thermal annealing for the buried N+ layer.

7. The method of claim 6, characterized in that, the step of annealing the buried N+ layer further comprises:

after performing the rapid thermal annealing of the buried N+ layer, performing a high temperature annealing for the buried N+ layer, with an annealing temperature from 800° C. to 1350° C. and an annealing time from 5 minutes to 120 minutes.

8. The method of claim 1, wherein, the step of annealing the buried N+ layer comprises:

performing a high temperature annealing of the buried N+ layer, with an annealing temperature from 800° C. to 1350° C. and an annealing time from 5 minutes to 120 minutes.

9. A method of manufacturing a semiconductor device, comprising:

forming a buried N+ layer in an upper portion of a P-type substrate;

performing ion implantation on the buried N+ layer;

performing a high temperature annealing of the buried N+ layer, with an annealing temperature from 800° C. to 1350° C. and an annealing time from 5 minutes to 120 minutes; and forming an epitaxial semiconductor layer on the buried N+ layer through epitaxial deposition, wherein, an upper portion of said epitaxial semiconductor layer is doped to form a P+ region and a portion of said epitaxial semiconductor layer underlying said P+ region is doped to form an N− region;

wherein said P+ region and said N− region form a diode, and said epitaxial semiconductor layer has a thickness greater than or equal to the total vertical length of said P+ region and said N− region.

10. The method of claim 9, wherein, before performing a high temperature annealing of the buried N+ layer, said method further comprises:

performing a rapid thermal annealing of the buried N+ layer.

11. The method of claim 9, further comprising:

etching said buried N+ layer and said epitaxial semiconductor layer to form a strip buried N+ layer and a strip epitaxial semiconductor layer, respectively; and etching said strip epitaxial semiconductor layer to form a columnar epitaxial semiconductor layer.

12. The method of claim 11, wherein, said P+ region is electrically connected to a bit line of a phase change memory cell array, and said buried N+ layer is electrically connected to a word line of said phase change memory cell array.

13. A method of manufacturing a semiconductor device, comprising:

forming a buried N+ layer in an upper portion of a P-type substrate;

performing ion implantation on the buried N+ layer;

annealing the buried N+ layer; and forming an epitaxial semiconductor layer on the buried N+ layer through epitaxial deposition, wherein, an upper portion of said epitaxial semiconductor layer is doped to form a P+ region and a portion of said epitaxial semiconductor layer underlying said P+ region is doped to form an N− region, wherein, said P+ region and said N− region form a diode, and said epitaxial semiconductor layer has a thickness greater than or equal to the total vertical length of said P+ region and said N− region.

14. The method of claim 13, further comprising:

etching said buried N+ layer and said epitaxial semiconductor layer to form a strip buried N+ layer and a strip epitaxial semiconductor layer, respectively; and etching said strip epitaxial semiconductor layer to form a columnar epitaxial semiconductor layer.

15. The method of claim 14, wherein, said P+ region is electrically connected to a bit line of a phase change memory cell array, and said buried N+ layer is electrically connected to a word line of said phase change memory cell array.

16. The method of claim 13, wherein, annealing the buried N+ layer comprises performing a rapid thermal annealing of the buried N+ layer.

* * * * *